United States Patent [19]
Rubner et al.

[11] 4,292,398
[45] Sep. 29, 1981

[54] METHOD FOR THE PREPARATION OF RELIEF STRUCTURES BY PHOTOTECHNIQUES

[75] Inventors: Roland Rubner, Röttenback; Eberhard Kühn, Hemhofen; Hellmut Ahne, Röttenbach, all of Fed. Rep. of Germany

[73] Assignee: Siemens Aktiengesellschaft, Munich, Fed. Rep. of Germany

[21] Appl. No.: 148,143

[22] Filed: May 9, 1980

[30] Foreign Application Priority Data

May 16, 1979 [DE] Fed. Rep. of Germany ....... 2919840

[51] Int. Cl.$^3$ ................................................ G03C 5/00
[52] U.S. Cl. ..................................... 430/306; 430/281; 430/287; 430/322; 430/919
[58] Field of Search ............... 430/281, 287, 306, 322, 430/919

[56] References Cited

U.S. PATENT DOCUMENTS

| Re. 30,186 | 1/1980 | Rubner et al. | 430/325 |
| 3,475,176 | 10/1969 | Rauner | 430/919 |
| 3,749,713 | 7/1973 | Clecak et al. | 430/919 |
| 3,957,512 | 5/1976 | Kleeberg et al. | 430/283 |
| 3,979,426 | 9/1976 | Demajistre | 430/287 |

Primary Examiner—Jack P. Brammer
Attorney, Agent, or Firm—Kenyon & Kenyon

[57] ABSTRACT

The invention relates to a method for making more efficient the preparation of relief structures by phototechniques from mixtures containing acrylate- and/or methacrylate-group-containing polymers and photo-initiators. For this purpose, the invention provides the use of aromatic azides free of maleinimide groups as photo-initiators. The method according to the invention is suitable particularly for the structurization by phototechniques of insulating materials as well as of semiconductor and conductor materials.

7 Claims, No Drawings

METHOD FOR THE PREPARATION OF RELIEF STRUCTURES BY PHOTOTECHNIQUES

BACKGROUND OF THE INVENTION

The invention relates to a method for the preparation of relief structures by phototechniques from mixtures containing acrylate- and/or methacrylate-group-containing polymers and photo-initiators.

One of the most accurate structuring methods for insulating materials, semiconductor and conductor materials in electrical engineering is the phototechnique. In this process resist relief structures generated by phototechniques are copied onto substrates by suitable methods such as etching, vapor deposition and electroless or electrodeposition plating. Resist relief structures can furthermore also perform a permanent protection function, for example, as insulating material.

In a method known from U.S. Pat. No. 3,957,512 and U.S. Pat. Re. 30,186, both incorporated herein by reference, relief structures are made from highly heat-resistant polymers. For this purpose, radiation-sensitive soluble preliminary polymer stages are applied to a substrate in the form of a layer or a film; the radiation-sensitive layer or foil is then exposed through negative patterns; and subsequently, the non-irradiated layers or film portions are removed from the substrate. If necessary, this can be followed by tempering the relief structure obtained. Soluble preliminary polymer stages used with this method are polyaddition or polycondensation products of polyfunctional carbocyclic or heterocyclic compounds containing radiation-sensitive radicals, with diamines, diisocyanates, bis-acid chlorides or dicarboxylic acids. The compounds carrying the radiation-sensitive radicals contain two carboxyl, carboxylic acid chloride, amino, isocyanate or hydroxyl groups suitable for addition or condensation reactions and partially, in ortho or peri-position thereto, radiation-reactive groups bound to carboxyl groups as esters. According to U.S. Pat. No. Re. 30,186, these radiation-reactive groups are oxyalkylene-acrylate or oxyalkylene-methacrylate groups.

The light sensitivity of resist materials such as photo-reactive polymers can be increased through addition of photo-initiators and photo-sensitizers. This is important because the economics of structuring of surfaces by phototechniques dictate that the time for which the expensive exposure equipment is used be as short as possible, i.e., the highest possible sensitivity of the photoresist is required. In the known method, compounds such as Michler's ketone, i.e., 4,4'-bis(dimethylamino)-benzophenone, benzoin ether, 2-tert-butyl-9,10-anthraquinone, 1,2-benz-9,10-anthraquinone and bis(diethylamino)-benzophenone are added to the preliminary polymer stages for this purpose. To increase the light sensitivity, copolymerizable radiation-sensitive maleinimides also can be added to the preliminary polymer stages.

SUMMARY OF THE INVENTION

It is an object of the invention to further increase the photoreactivity of mixtures which contain acrylate- and/or methacrylate-group-containing polymers and photo-initiators in order to render preparation of relief structures by phototechniques still more efficient.

According to the invention, this and other objects are achieved by using as photo-initiators aromatic azides which are free of maleinimide groups. The term "aromatic", for the purpose of the present invention, is defined as benzene derivatives including anellated, i.e., condensed ring systems.

The method according to the invention permits efficient generation of cross-linked organic relief structures through brief selective irradiation of film layers and subsequent removal of the unexposed film portions. This is possible because the acrylate- or methacrylate-group-containing polymers become more photo-reactive through the addition of azides.

The following compounds, for example, can be used as photo-initiators; 4,4'-diazidostilbene, 4,4'-diazidobenzophenone, 4,4'-diazido-dibenzalacetone and 2,6-di(4'-azidobenzal)-4-methyl-cyclohexanone. Preferred compounds for use in the method according to the invention are sulfonylazides, for example, phenylsulfonylazide, p-methoxyphenylsulfonylazide, p-acetamidophenylsulfonylazide and 1- or 2-naphthylsulfonylazide. These compounds are particularly stable with regard to temperature and therefore allow wide processing latitude.

To the photo-reactive mixture can further be added sensitizers, such as Michler's ketone, and maleinimides, especially N-phenylmaleinimide. In this manner, the light sensitivity of the mixture can be increased still further.

The use of azides as photo-initiators for resists, especially negative resists, is known per se. Heretofore, azides have been used only in diallylphthalate prepolymers, polyisoprene resins and polyvinyl-cinnamates (see: W. S. DeForest, "Photoresist", McGraw-Hill Book Company, 1975, pages 35 to 41). However, the fact that this class of compounds is also suitable for use in acrylate- and methacrylate-group-containing polymers was entirely surprising and could not be forseen. For, contrary to diallylphthalate prepolymers, polyisoprene resins and polyvinyl cinnamates, acrylate- and methacrylate-group-containing resins are by nature considerably more reactive, so that it was highly surprising that they can still be handled in the presence of azides.

DETAILED DESCRIPTION OF THE INVENTION

The invention will now be explained in greater detail with the aid of illustrative examples.

EXAMPLE 1 (REFERENCE TEST)

From pyromellithic acid dianhydride, methacrylic-acid-2-hydroxy ethyl ester and 4,4'-diaminodiphenyl ether, a soluble preliminary polymer stage is prepared according to U.S. Pat. Re. 30,186 in the form of polyamido carboxylic acid methacrylate of the following structure

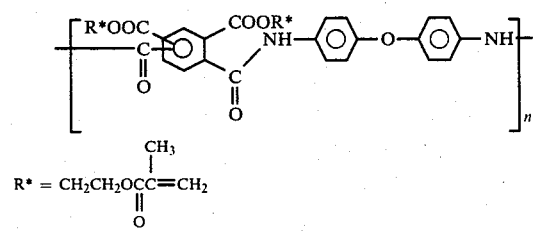

(methacrylate resin).

10 parts by weight of the methacrylate resin are dissolved together with 0.5 parts by weight N-phenylmaleinimide and 0.2 parts by weight Michler's ketone in 22 parts by volume of a mixture of dimethylacetamide and dioxane (volume ratio 1:1). The solution is then filtered and centrifuged on aluminum foil to form uniform films. After drying for 1½ hours at 60° C. in a vacuum, the thickness of the film is 6 μm. The films obtained in this manner are then exposed through a contact copy with a 500-W very-high-pressure mercury lamp. With an exposure time of 60 to 75 seconds and after development with a 1:1 mixture of γ-butyrolactone and toluene (developing time 16 seconds), relief structures with sharp edges and a resolution of 10 μm are obtained. These samples are tempered for 1 hour at 340° C.; the resolution and the sharpness of the edges of the relief structures are not adversely affected.

EXAMPLE 2

10 parts by weight of the methacrylate resin described in Example 1 are used together with 0.4 parts by weight p-acetamido-phenylsulfonylazide and 0.2 parts by weight Michler's ketone according to Example 1 for the preparation of films with a thickness of 6 μm. With such films, sharp-edged relief structures are obtained after an exposure time of 45 seconds under the exposure and development conditions given in Example 1.

EXAMPLE 3

By means of a reaction solution which contains 10 parts by weight of the methacrylate resin according to Example 1, 0.17 parts by weight p-acetamido-phenylsulfonylazide, 0.2 parts by weight Michler's ketone and 0.13 parts by weight N-phenylmaleinimide, films 6 μm thick are generated on aluminum foils. Under the same exposure and development conditions as in Example 1, here, too, an exposure time of only 45 seconds is required to prepare relief structures with sharp edges from such films.

EXAMPLE 4 (REFERENCE TEST)

In a reaction solution according to Example 1, 0.1 parts by weight benzoinisopropyl ether are used instead of 0.2 parts by weight Michler's ketone, and from this reaction solution films with a thickness of 7 μm are prepared. Under the conditions given in Example 1, the exposure time required to generate the relief structure is 300 to 420 seconds.

EXAMPLE 5

A reaction solution is prepared from 10 parts by weight methacrylate resin, 0.4 parts by weight p-acetamidophenylsulfonylazide and 0.1 parts by weight benzoinisopropylether in accordance with Example 1. With this reaction solution, films 7 μm thick are generated. With such films, the exposure time for generating a relief structure in the manner described is only 120 seconds.

What is claimed is:
1. In a method for the preparation of relief structures by phototechniques wherein a mixture of a photo-initiator and an unsaturated photo- or radiation-sensitive polymer containing ethylenically unsaturated acrylate and/or methacrylate groups is applied to a substrate in the form of a layer or foil; the layer or foil is exposed or irradiated through a mask; and the non-exposed or non-irradiated portions of the layer or foil are removed from the substrate to obtain a relief structure, the improvement comprising utilizing as said photo-initiator an aromatic azide free of maleinimide groups.
2. The method according to claim 1 wherein said photo-initiator is a sulfonylazide.
3. The method according to claim 1 wherein said mixture further contains a sensitizer.
4. The method according to claim 3 wherein said sensitizer is 4,4'-bis(dimethylamino)-benzophenone.
5. The method according to claim 1 wherein said mixture further contains a maleinimide.
6. The method according to claim 5 wherein said maleinimide is N-phenylmaleinimide.
7. The method according to claim 1 wherein said relief structure obtained is subsequently annealed.

* * * * *